(12) United States Patent
Ovshinsky et al.

(10) Patent No.: US 6,723,421 B2
(45) Date of Patent: Apr. 20, 2004

(54) SEMICONDUCTOR WITH COORDINATIVELY IRREGULAR STRUCTURES

(75) Inventors: Stanford R. Ovshinsky, Bloomfield Hills, MI (US); Boil Pashmakov, Troy, MI (US); David V. Tsu, Auburn Hills, MI (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 87 days.

(21) Appl. No.: 09/971,881

(22) Filed: Oct. 5, 2001

(65) Prior Publication Data

US 2003/0096098 A1 May 22, 2003

(51) Int. Cl.$^7$ .............................. B32B 3/26; H01L 31/00
(52) U.S. Cl. ................ 428/315.7; 428/312.2; 428/307.3; 428/307.7; 428/310.5; 136/261; 136/258; 423/324; 423/325; 423/341; 423/345; 423/347; 423/348
(58) Field of Search ............... 428/307.3, 307.7, 428/310.5, 312.2, 315.7; 136/261, 258; 423/348, 324, 341, 325, 345, 347

(56) References Cited

U.S. PATENT DOCUMENTS 5,103,284 A    4/1992   Ovshinsky et al.
5,320,822 A  * 6/1994   Ozin et al. .................. 423/700
5,627,081 A  * 5/1997   Tsuo et al. ..................... 438/57
6,087,580 A    7/2000   Ovshinsky et al.

OTHER PUBLICATIONS

K. Fukutani et al, "Extremely Narrow Band Gap, —1.50eV, Amorphous Silicon," Materials Research Society Symposium Proceedings, 1998, pp. 211–216, vol. 507, Materials Research Society, Pittsburgh, PA, USA.

D.V. Tsu, et al, "Heterogeneity in Hydrogenated Silicon: Evidence for Intermediately Ordered Chainlike Objects," Physical Review B, 2001, pp. 125338:1–9, vol. 63. American Physical Society, College Park, MD, USA.

* cited by examiner

*Primary Examiner*—Elizabeth M. Cole
*Assistant Examiner*—Hai Vo
(74) *Attorney, Agent, or Firm*—Kevin L. Bray; Marvin S. Siskind (57) ABSTRACT

A non-single crystalline semiconductor material includes coordinatively irregular structures characterized by distorted chemical bonding, reduced dimensionality and novel electronic properties. A process for forming the material permits variation of the size, concentration and spatial distribution of coordinatively irregular structures. The electronic properties of the material can be changed by controlling the characteristics of the coordinatively irregular structures.

28 Claims, 3 Drawing Sheets

FIG. 3

SEMICONDUCTOR WITH COORDINATIVELY IRREGULAR STRUCTURES

FIELD OF THE INVENTION

This invention relates generally to semiconductor materials with novel properties and internal structures. In particular, the invention relates to a non-single crystalline semiconductor, and a process for making same, comprised of coordinatively irregular structures, each of which has distorted chemical bonding, reduced dimensionality, and a state of structural order distinct from the amorphous and single crystalline forms of the semiconductor.

BACKGROUND OF THE INVENTION

Semiconductor materials have had a tremendous impact on the quality of life and economic progress across the world over the past four decades. Semiconductor materials are integral to modern electronic devices such as transistors, diodes, LEDs, and lasers. These and related devices are responsible for the advent of the information age with all of its promise for today and tomorrow.

First generation electronic devices were based primarily on crystalline silicon. Single crystalline silicon, especially when doped to produce n-type and p-type material, was and continues to be successfully used in a variety of electronic devices. The efficacy of crystalline silicon is due to its high charge carrier mobility and suitability for high speed electronics applications.

The primary limitations of single crystalline silicon for photovoltaic applications are its indirect bandgap and the inability to produce it in large areas in a continuous manufacturing process. The indirect bandgap of crystalline silicon has two important deleterious consequences. First, optical transitions from the valence band to the conduction band of crystalline silicon occur with weak intensity and second, crystalline silicon is unable to emit light. As a result, crystalline silicon is impractical for many optical and photonic applications.

Although single crystalline silicon can be prepared with a high degree of purity and with well-controlled spatial distributions of n and p type dopants, its preparation is slow and not amenable to high speed manufacturing processes. Consequently, the preparation of single crystalline silicon is expensive and cost considerations limit its range of applications.

The need for an optically efficient semiconductor material for laser, LED, solar energy and photovoltaic applications has motivated much research over the years. Direct gap III–V materials such as GaAs and InP exhibit strong optical transitions and have been shown to be effective light emitting and absorbing materials. These materials, however, are only practically useful in the single crystalline state and are subject to many of the same processing and cost constraints associated with crystalline silicon. Since III–V materials and alloys are compound semiconductors, their preparation is further complicated by the need for a proper stoichiometric ratio of two or more elements. The need for uniform chemical composition imposes additional restrictions on the preparation and processing of III–V materials and alloys. Consequently, III–V materials and alloys are currently limited to niche applications.

Amorphous silicon has emerged as the leading material for large scale solar energy and photovoltaic applications. Amorphous silicon is an unusual material in that although it is silicon based, it possesses a direct bandgap and therefore exhibits high absorption efficiency. Since the bandgap of amorphous silicon occurs in the visible part of the spectrum, it has been demonstrated to be an effective material for solar cells and other photovoltaic devices capable of being powered by the sun. The amorphous nature of amorphous silicon precludes the need to establish the structural regularity associated with single crystalline silicon. As a result, the growth rate of amorphous silicon is much faster than that for single crystalline silicon and amorphous silicon can be prepared on a large scale by a variety of deposition techniques in a rapid, continuous and cost-effective manner.

S. R. Ovshinsky recognized that the disordered nature of amorphous materials provides new opportunities for tailoring electronic properties. S. R. Ovshinsky believed that crystalline solids are restrictive in terms of their properties because of the limited number of structures available and the limited flexibility in achieving new chemical compositions. These limitations are inherent to the unforgiving periodic and ordered structural requirements of crystalline solids. By embracing the structural disorder of the amorphous state, S. R. Ovshinsky argued, it becomes possible to achieve new structures and new compositions with new electronic properties.

S. R. Ovshinsky further showed that it was possible to prepare materials that included features of both the amorphous and single crystalline forms of the composition. These materials typically comprise an amorphous or crystalline matrix that contains regions of ordered clusters or aggregations of atoms with a degree of order intermediate between the highly ordered single crystalline form and the highly disordered amorphous form. The presence of the clusters or intermediate range order aggregations imparts unusual electronic properties to the material and has motivated further development of this fundamentally new class of materials. This seminal concept of achieving new materials with superior electronic properties by varying the degree of order through atomic engineering has been described in, for example, "Amorphous and Disordered Materials—The Basis of New Industries", S. R. Ovshinsky, Materials Research Society Symposium Proceedings, Vol. 554, pp. 399–412, 1999; "Heterogeneity in Hydrogenated Silicon: Evidence for Intermediately Ordered Chainlike Objects", D. V. Tsu et al., Physical Review B, Vol. 63, pp. 125338: 1–9, 2001; "Semiconductor with Ordered Clusters", S. R. Ovshinsky et al., U.S. Pat. No. 6,087,580; and "Semiconductor having Large Volume Fraction of Intermediate Range Order Material", S. R. Ovshinsky et al., U.S. Pat. No. 5,103,284.

From the viewpoint of solar energy applications, amorphous silicon is not an optimal material because it does not absorb the full range of photon energies present in the solar spectrum. Since amorphous silicon has a bandgap energy of approximately 1.8 eV, it is only capable of efficiently absorbing light with photon energies greater than about 1.8 eV. (The UV and higher energy visible portions of the solar spectrum.) The solar spectrum, however, contains a significant amount of light with photon energies less than 1.8 eV. (The lower energy visible and infrared portions of the solar spectrum.) As a result, solar energy devices incorporating only amorphous silicon capture only a limited fraction of the total energy available from sunlight.

In order to increase the amount of sunlight collected, practical solar energy devices are normally based on multilayer structures comprised of amorphous silicon to capture the high photon energy portion of the solar spectrum and an alloy of amorphous silicon with a bandgap narrowing element to capture the low photon energy portion of the solar spectrum. A bandgap narrowing element is an element that leads to a reduction in the bandgap energy and consequently an increased absorption of lower photon energy light. Bandgap narrowing elements preferably lower the bandgap while maintaining a direct bandgap so that the resulting alloy material retains the high absorption strength characteristic of amorphous silicon. Germanium is the most commonly used bandgap narrowing element. Alloys of silicon and germanium are capable of strongly absorbing the low energy visible and infrared portions of the solar spectrum and lead to substantial improvements in sunlight-to-electricity conversion efficiency when incorporated into solar energy devices.

Although the incorporation of germanium in solar energy devices improves device performance, its inclusion has two disadvantages. First, the most common source of germanium, germane gas ($GeH_4$), is expensive and not widely available. Second, incorporation of germanium adds complexity to the process used to manufacture solar energy and photovoltaic devices. Additional processing units are needed to supply and deposit germanium during manufacturing. These units add cost and time to the manufacturing process.

Based on the prior art, it would be desirable to have a material, that does not include Ge, with sufficiently strong absorbance in the red and/or near-infrared to be useful in solar energy and photovoltaic devices. A material capable of absorbing as many of the photon energies of the solar spectrum not absorbed by amorphous silicon is preferred. Ideally, the material should be readily integrable with amorphous silicon to expedite and economize the processing of multilayer structures. The material itself should also be inexpensive and readily available.

SUMMARY OF THE INVENTION

There is disclosed herein a non-single crystalline semiconductor material comprised of silicon and a process for making same. The material is an assembly of coordinatively irregular structures, each of which has a state of structural order and bonding configuration distinct from the amorphous and single crystalline forms of the semiconductor. The electronic properties of each constituent coordinatively irregular structure are determined by its state of structural order, coordination properties and bonding configuration. By controlling the size of individual coordinatively irregular structures and the size and spatial distributions of coordinatively irregular structures within a semiconductor body, it is possible to achieve silicon-based materials with desirable new properties. The electronic properties of the semiconductor material of the present invention are desirable in applications such as solar cells, photovoltaic devices, lasers, LEDs, transistors, and diodes. In one embodiment, for example, the material of the present invention is silicon-based and is incorporated as the bottom layer of a triple junction solar cell thereby making it possible to efficiently collect the long wavelength portion of the solar spectrum without using germanium or other bandgap narrowing elements.

The material of the present invention is prepared by repeated application of a two-step process. In a formation step, a sub-coalescent amount of a non-single crystalline silicon material is formed. A sub-coalescent amount is an amount of material that is insufficient to provide full coverage of the surface upon which it is formed. Instead, portions of the surface upon which formation occurs remain uncovered. As a result, the sub-coalescent structures that are formed in the formation step contain a high fraction of surface atoms and possesses a distorted bonding configuration. The purpose of the formation step is to provide sub-coalescent structures that will subsequently be stabilized and incorporated into the body of the ultimate semiconductor to be formed. In the treatment step, the sub-coalescent structures formed in the formation step are treated with a plasma comprised of hydrogen, fluorine or a combination of hydrogen and fluorine in a suitable reaction chamber. The purpose of the second step is to terminate the coordinatively unsaturated surface atoms of the sub-coalescent structures to produce and stabilize coordinatively irregular structures that are characterized by a state of structural order, coordination properties and chemical bonding that are distinct from those of the amorphous and crystalline phases with the same composition.

Repeated application of the two processing steps leads to the preparation of an ultimate semiconductor body comprised of an assembly of individual coordinatively irregular structures. Since the constituent coordinatively irregular structures are characterized by unconventional structural order, coordination properties and bonding configurations, they individually possess unusual properties and when collectively assembled, lead to new semiconductor materials with heretofore unobserved properties.

DETAILED DESCRIPTION OF THE INVENTION

The present invention concerns a non-single crystalline semiconductor material comprising an assembly of coordinatively irregular structures, each of which has a state of structural order distinct from the amorphous and single crystalline forms of the semiconductor, and a process for making same. The state of structural order of each coordinatively irregular structure is determined by the number of atoms contained in the structure, their geometric arrangement and the regularity of the chemical bonding of the atoms in the structure. The electronic properties of a given coordinatively irregular structure are determined by its state of structural order, coordination properties and chemical bonding. By controlling the size of constituent coordinatively irregular structures, the regularity of chemical bonding within the constituent coordinatively irregular structures, the size distribution of coordinatively irregular structures within a semiconductor body, and interactions between constituent coordinatively irregular structures within a semiconductor body, it is possible to control the electronic properties of semiconductor materials with this invention. Since the coordinatively irregular structures possess an unusual type of chemical bonding characterized by variable distortions from regular tetrahedral coordination and a state of order intermediate between the crystalline and amorphous forms of silicon, the coordinatively irregular structures, and assembly thereof to form the ultimate semiconductor body of the present invention, possess heretofore unrealized electronic properties that are useful in a variety of devices including solar cells, photovoltaic devices, lasers, LEDs, transistors, and diodes. In one embodiment of the invention, for example, the semiconductor material of the present invention comprises silicon, exclusive of a bandgap narrowing element, and is useful as a material for absorbing red and near-infrared wavelengths in photovoltaic devices.

The material of the present invention is prepared by repeated application of a two-step process. In a formation step, a sub-coalescent amount of a non-single crystalline silicon material is formed. A sub-coalescent amount is an amount of material that is insufficient to provide full coverage of the surface upon which it is formed. Instead, portions of the surface upon which formation occurs remain uncovered and growth of the ultimate semiconductor body does not occur in a layer-by-layer fashion. The sub-coalescent structures that are formed in the formation step contain a high fraction of surface atoms and possess a distorted bonding configuration. The formation step can be accomplished by a variety of methods including physical vapor deposition, chemical vapor deposition, plasma-enhanced chemical vapor deposition, laser ablation sputtering, and evaporation. Representative suitable reactants for this step include $SiH_4$, $Si_2H_6$ and related silicon compounds either undiluted or diluted with $H_2$. The purpose of the formation step is to provide sub-coalescent structures that will subsequently be stabilized and incorporated into the body of the ultimate semiconductor to be prepared.

In the treatment step, the sub-coalescent structures formed in the formation step are treated with a plasma comprised of hydrogen, fluorine, argon, nitrogen, oxygen or a combination thereof in a suitable reaction chamber. The purpose of the second step is to terminate the coordinatively unsaturated surface atoms of the sub-coalescent structures to produce and stabilize coordinatively irregular structures that are characterized by a state of structural order, coordination properties and chemical bonding that are distinct from those of the amorphous and crystalline phases with the same composition.

Repeated application of the two processing steps leads to the preparation of an ultimate semiconductor body comprised of an assembly of individual coordinatively irregular structures. The size, chemical bonding, coordination and state of order of the constituent coordinatively irregular structures are variably controllable by varying relevant parameters in the first and second processing steps. As a result, the electronic properties of the constituent coordinatively irregular structures can be controlled by varying the processing conditions associated with the two steps. Since the electronic properties manifested by the ultimate semiconductor body depend cumulatively and synergistically on the electronic properties of the constituent coordinatively irregular structures assembled therein, the present invention permits the preparation of a large number of materials with a wide range of properties.

The creation, stabilization and assemblage of coordinatively irregular structures are the critical features of the present invention. The coordinatively irregular structures, and the sub-coalescent structures from which they are stabilized, correspond to a unique phase of matter. Whereas single crystalline silicon is characterized by extended periodicity and long range structural order and amorphous silicon is characterized by the absence of periodicity and by randomness of structure, the sub-coalescent and coordinatively irregular structures of this invention are paradoxically both intermediate and completely distinct in behavior relative to crystalline and amorphous silicon. The sub-coalescent and coordinatively irregular structures of the present invention are neither periodic nor aperiodic and are neither perfectly ordered nor random. Instead, they are quasi-periodic and quasi-ordered structures that only become viable in the limited dimensionality of the sub-coalescent and coordinatively irregular structures.

In a sub-coalescent or coordinatively irregular silicon structure, the silicon atoms are unable to achieve the regular tetrahedral bonding present in crystalline silicon. Regular tetrahedral bonding is predicated upon satisfying the three-dimensional coordination requirements of silicon. Included among these requirements are the potential for each silicon atom to bond to four other atoms in a three-dimensional arrangement and a sufficient degree of atom mobility during the preparation process to permit the structural relaxation necessary to establish the equidistant and equiangular bonding between silicon atoms characteristic of regular tetrahedral bonding. In crystalline silicon, the three-dimensional coordination requirements are met because of the sufficient availability of atoms, ability of atoms to arrange in three dimensions, and the equilibrium nature of its growth process. An equilibrium growth process allows for the atom mobility necessary to establish a regular tetrahedral bonding geometry. In the growth of amorphous silicon, sufficient atoms and dimensionality are available to allow silicon atoms to achieve fourfold coordination, but the non-equilibrium nature of the growth process precludes the structural relaxation necessary for silicon to achieve regular tetrahedral coordination. Instead, the resulting structure of amorphous silicon is "frustrated" and characterized by a random continuous distribution of bond angles, bond lengths and distortions from regular tetrahedral coordination. Amorphous silicon has a structure that is kinetically "frozen", or inhibited, from achieving the thermodynamically most stable regular tetrahedral coordination that occurs in crystalline silicon.

In the sub-coalescent and coordinatively irregular structures of the present invention, the dimensionality is restricted and prevents silicon atoms from achieving regular tetrahedral coordination. The sub-coalescent and coordinatively irregular structures have atomic scale thickness in one or two spatial dimensions and non-atomic scale thickness in the other spatial dimensions or dimension. As used herein, atomic scale thickness refers to thicknesses of one atom to a few atoms. One feature associated with atomic scale thickness is that it represents a thickness that is sufficiently small to preclude attainment of the rigidity of structure found in extended three dimensional structures. As a result, the sub-coalescent and coordinatively irregular structures of the present invention are mechanically flexible and able to achieve unconventionally distorted structures with unusual properties.

A spatial direction with atomic thickness shall hereinafter be referred to as a direction of atomic thickness and other directions shall hereinafter be referred to as directions of non-atomic thickness.

The atomic thickness aspect of the sub-coalescent and coordinatively irregular structures of the present invention precludes silicon atoms from satisfying the three-dimensional coordination requirements. Growth of the sub-coalescent structures in the first step (the formation step) of the two step process of the present invention occurs primarily in directions of non-atomic thickness. The growth is more properly described as "island" or "columnar" growth rather than growth leading to the formation of a three-dimensional network. The bonds between the silicon atoms comprising the sub-coalescent structures are strained in the sense that the bond angles and bond lengths of silicon are distorted relative to regular tetrahedral geometry as a consequence of the presence of directions of atomic thickness. The coordination environments of many of the silicon atoms are also unsaturated in the sense that fourfold coordination is not achieved. The open, unsaturated bonding sites of the coordinatively unsaturated silicon atoms correspond to dangling bond defects and are sites with a high potential to react.

Bond strain and coordinative unsaturation of silicon do not occur to an appreciable extent in crystalline silicon, but do occur in amorphous silicon. The nature and extent of bond strain and coordinative unsaturation, however, differ in the sub-coalescent and coordinatively irregular structures of the present invention and amorphous silicon. As indicated above, the silicon atoms of amorphous silicon are significantly distorted from a regular tetrahedral arrangement by virtue of a non-equilibrium growth process that acts to kinetically prevent the motion of silicon atoms. The extended three-dimensional nature of amorphous silicon imparts a rigidity to its structure that effectively inhibits the relaxation of silicon atoms toward a regular tetrahedral geometry. The relaxation of an individual silicon atom is resisted by all neighboring silicon atoms. In order for relaxation to occur, a substantial number of silicon atoms must cooperatively rearrange. Since a cooperative rearrangement process is statistically and energetically unfavored, the structure of amorphous silicon retains the highly distorted structure present upon its formation.

In the sub-coalescent structures of the present invention, by contrast, a relaxation of silicon atoms is facilitated by the nature of the structure. The atomic thickness aspect of sub-coalescent structures implies that an extended three-dimensional network of atoms is not available to resist the relaxational motion of silicon atoms in sub-coalescent structures. Resistance is limited to the directions of non-atomic thickness. The extent of resistance to relaxation depends on the size of the sub-coalescent sub structure. Structures containing a small number of atoms experience little resistance and are structurally more flexible than structures with a large number of atoms. Since the size of the sub-coalescent structures can be controlled by the method of the present invention, the extent of resistance, and hence the extent of structural relaxation, can be controlled.

The net result is that the silicon atoms of the sub-coalescent structures of the present invention are better able to relax toward a regular tetrahedral arrangement than the silicon atoms of amorphous silicon. Because of the atomic scale thickness aspect, however, the silicon atoms of the sub-coalescent structures are unable to organize into a three dimensional arrangement. The sub-coalescent structures are therefore partially relaxed and in a quasi-ordered structural state somewhere between the disordered state of amorphous silicon and the ordered state of crystalline silicon.

The sub-coalescent structures of the present invention also include a greater proportion of coordinatively unsaturated silicon atoms upon formation than amorphous silicon.

In amorphous silicon, the coordinatively unsaturated silicon atoms reside principally on the surface. Since amorphous silicon possesses an extended three-dimensional structure, most of its atoms are in the interior of the material rather than on the surface. Sub-coalescent structures, on the contrary, include a high fraction of coordinatively unsaturated surface silicon atoms. The atomic scale thickness aspect necessarily implies that many atoms of a sub-coalescent structure are surface atoms with atoms at the edges experiencing the greatest extent of coordinative unsaturation.

The present inventors have recognized that the partially relaxed state of order and the preponderance of coordinatively unsaturated silicon atoms in the sub-coalescent structures of the present invention constitute a unique phase of matter. This unique phase of matter possesses unusual structure and chemical bonding, both of which are irregular and distorted, but neither fully ordered nor fully disordered. The present inventors have discovered that this unique phase of matter offers heretofore unavailable electronic properties.

In order to realize the unique electronic properties of the present invention, it is necessary to stabilize the sub-coalescent structures. The sub-coalescent structures are in a thermodynamic state that is inherently unstable. Without further treatment, continued growth in the presence of reactants after formation of a sub-coalescent structure renders the structure unstable with respect to rearrangement to form an extended three-dimensional structure of the type found in amorphous silicon. In order to prevent such rearrangement, it is necessary to arrest the evolution of a sub-coalescent structure after its formation. Once a sub-coalescent structure is arrested and stabilized, additional sub-coalescent structures can be formed and added to the growing material without disturbing earlier formed sub-coalescent structures. By repeating the steps of forming and stabilizing sub-coalescent structures, a semiconductor body comprised of an assembly of stabilized sub-coalescent structures can be prepared which preserves the unique electronic properties associated with the constituent stabilized sub-coalescent structures.

The present inventors believe that the sub-coalescent structures of the present invention can be treated with a plasma to produce the stabilized sub-coalescent structures that will be referred to as coordinatively irregular structures. In the plasma treatment step, the plasma comprises hydrogen, fluorine, argon, oxygen, nitrogen or a combination thereof. Plasma treatment with hydrogen, fluorine or a combination thereof is next discussed and is emphasized for illustration purposes in the remainder of the description. Plasma activation of hydrogen or fluorine provides reactive radical species that readily bond to silicon. The effect of plasma treatment on sub-coalescent structures depends on the plasma density. At low plasma densities, the plasma activated radical species supplied in the treatment step passivate the dangling bonds associated with the silicon atoms that comprise the sub-coalescent structures. In the passivation process, plasma activated hydrogen or fluorine terminates coordinatively unsaturated bonding positions of silicon atoms in sub-coalescent structures to form Si—H or Si—F bonds. Since the terminal Si—H and Si—F bonds form on the surface of the sub-coalescent structures, the structures become stabilized through surface termination of reactive bonding sites by the plasma treatment step.

Formation of terminal bonds is believed by the present inventors to affect the sub-coalescent structures in at least three ways. First, termination of coordinatively unsaturated bonds removes dangling bond defects. Elimination of dangling bond defects improves the conductivity and electronic properties of sub-coalescent structures. Second, establishment of four coordinate silicon atoms leads to a partial relaxation of the strained bonds and structural distortions present in the originally formed, coordinatively unsaturated sub-coalescent structures. The unpaired electrons associated with dangling bond defects exert strong Coulombic repulsions on the electrons in the Si—Si bonds of the as formed sub-coalescent structures. These repulsions lead to significant bond strain and structural distortions. Upon termination of the dangling bonds, the unpaired electrons become associated with a terminal bond. This association spatially localizes the unpaired electrons and reduces their influence on other bonds to silicon. As a result, a partial relaxation of the structure to a more regular tetrahedral geometry occurs as non-tetrahedral distortions of bond angles and bond lengths decrease upon surface termination.

Third, formation of terminal bonds fills the coordination shell of silicon to produce silicon atoms with fourfold coordination. Surface termination is tantamount to extending the dimensionality of sub-monolayer structures, albeit in a limited way because terminal H and terminal F atoms can only bond to one silicon atom and therefore cannot initiate the formation of an extended three-dimensional structure as occurs in amorphous silicon. Termination of dangling bonds with H or F eliminates reactive dangling bond sites without introducing the possibility of further reaction to form extended three-dimensional structures. Once an as-formed sub-coalescent structure has been treated by an activated plasma of hydrogen or fluorine to become a surface-terminated coordinatively irregular structure, its unusual structure and properties are preserved and growth of a new sub-coalescent structure can commence atop or beside the surface-terminated coordinatively irregular structure.

In addition to the preceding effects, etching of sub-coalescent and coordinatively irregular structures occurs when a high density plasma is used in the treatment step. High density hydrogen or fluorine plasmas contain reactive hydrogen or fluorine radical species that continue to interact with the material after dangling bonds are terminated. The highly reactive radical species are capable of cleaving intact bonds in the sub-coalescent structures to create new dangling bonds that can subsequently be terminated by other radicals in the plasma. Although energy is required to break intact bonds in the material, an overall stabilization results upon termination of the dangling bonds so produced by hydrogen or fluorine radicals. Although all types of bonds (Si—Si along with Si—H and/or Si—F bonds formed upon surface termination) in sub-coalescent and coordinatively irregular structures are susceptible to cleavage, Si—Si bonds are most strongly affected because they have the weakest bond strength. As a result, prolonged exposure of sub-coalescent and coordinatively irregular structures to plasma generated hydrogen or fluorine radicals leads to a preferential conversion of Si—Si bonds to Si—H and/or Si—F bonds. Since hydrogen and fluorine bond to only one silicon atom, the net result of the etching process associated with high density plasmas is a disruption of the Si—Si network and the increasing formation of hydrogen and/or fluorine terminated surfaces at the expense of the contiguous Si—Si network. The net effect of etching is a size reduction or subdivision of the sub-coalescent or coordinatively irregular structures. Since the electronic properties of sub-coalescent and coordinatively irregular structures depend on size, the density of the plasma used in the treatment step can be used to constructively influence the bandgap and other electronic properties of the ultimate semiconductor material formed by this invention.

The effect of using fluorine in the treatment step differs from the effect of using hydrogen because terminated Si—F bonds are much stronger than terminated Si—H bonds. As a result, terminated Si—F bonds are much less susceptible to cleavage than terminated Si—H bonds. The use of fluorine in the treatment step, therefore, leads to more efficient disruption of the Si—Si network and a correspondingly different evolution of ordering and a different evolution of the spatial distribution and sizes of sub-coalescent and coordinatively irregular structures. Plasmas including argon, nitrogen, or oxygen will also lead to a different evolution of order and structure.

Under prolonged etching conditions, the formation of microcrystalline silicon and/or porous silicon can occur. Microcrystalline silicon is a disordered crystalline phase that is structurally more similar to single crystalline silicon than amorphous silicon. The formation of microcrystalline silicon represents a structural reorganization of silicon atoms and occurs when enhanced silicon atom mobility results from the cleavage of Si—Si bonds by the plasma. Porous silicon is a form of silicon that has high porosity and high surface area. It is a recently discovered form of silicon that has been demonstrated to have unusually efficient luminescence in the visible. It is conventionally prepared by an electrochemical method that is believed to etch silicon to impart fractal-like porosity and high surface area. As the duration of the treatment step relative to the formation step in the present invention increases, the resulting enhancement of the disruption of the silicon network leads to an increase in the porosity of the ultimate semiconductor body. In the limiting case of long treatment times, a porous silicon phase is expected to form.

With respect to the sub-coalescent and coordinatively irregular structures of the present invention, plasma-activated hydrogen and fluorine lead to competing effects. The tendency of hydrogen and fluorine to terminate dangling silicon bonds facilitates stabilization of sub-coalescent structures, while the tendency of hydrogen and fluorine to etch acts to break up sub-coalescent and coordinatively irregular structures. Through judicious selection of preparation conditions, the competing effects of hydrogen and fluorine can be constructively balanced in the present invention. As a result, hydrogen and fluorine provide additional degrees of freedom for controlling the size and spatial distribution of the stabilized coordinatively irregular structures in the ultimate semiconductor body of the present invention. Further control can be obtained by applying hydrogen and fluorine separately and sequentially in independent treatment steps as well as by using or including nitrogen, oxygen or argon in the plasma treatment step.

In concert with the density of plasma used in the treatment step, the present inventors believe that the duration or time of exposure of the treatment step also influences the disruption of the Si—Si network and size of coordinatively irregular structures. If allowed to persist for long durations, the present inventors believe that low density plasmas produce etching effects similar to those described hereinabove for high density plasmas. Similarly, at short durations, the present inventors believe that the primary effect of high density plasmas is to terminate dangling bonds rather than etch.

The material of the present invention is prepared by repeated application of a two-step process. The first step of the process, the formation step, involves formation of a sub-coalescent amount of a semiconductor material. This step can be accomplished by a variety of methods including physical vapor deposition, chemical vapor deposition, plasma-enhanced chemical vapor deposition, laser ablation sputtering, and evaporation. Suitable reactants for this step, when preparing an ultimate semiconductor body based on silicon, include $SiH_4$, $Si_2H_6$ and related silicon compounds either undiluted or diluted with $H_2$. The purpose of the first step is to provide the material of a sub-coalescent structure for incorporation into the body of the ultimate semiconductor to be formed. In the second step, the treatment step, the sub-coalescent material formed in the first step is treated with a plasma comprised of hydrogen, fluorine or a combination of hydrogen and fluorine. The plasma treatment of the second step arrests the evolution of the sub-coalescent structure produced in the first step through surface termination of reactive dangling bonds, etching, or the formation of a microcrystalline semiconductor, as described hereinabove. In the sub-coalescent regime, the state of order, chemical bonding and electronic properties of a collection of atoms evolves as the number of atoms in the collection increases. The treatment step preserves or increases the state of order, regularity of chemical bonding relative to tetrahedral configuration and preserves or improves the electronic properties of sub-coalescent structures as they are stabilized to form the coordinatively irregular structures found in the ultimate semiconductor of the present invention. If desired, etching conditions can be established to subdivide sub-coalescent or coordinatively irregular structures. If desired, microcrystalline and/or porous silicon domains can also be produced.

A variation of the process of the present invention is to divide the sub-coalescent structure formation step into two parts. In a first part, a three-dimensionally extended, non-sub-coalescent amount of semiconductor is formed by any growth technique. In a second part, the material so formed is etched sufficiently to produce a sub-coalescent structure that can subsequently be treated with a plasma according to the process of the present invention.

Repeated application of the formation and treatment steps leads to the production of an ultimate semiconductor body comprised of an assembly of constituent coordinatively irregular structures. The size, chemical bonding and state of order of each constituent coordinatively irregular structure contained in the ultimate semiconductor body is separately variable by controlling relevant parameters associated with the formation and treatment steps of the present invention. The contribution, therefore, of each constituent coordinatively irregular structure to the electronic properties of the ultimate semiconductor body can be controlled through the processing conditions. The electronic properties manifested by the ultimate semiconductor body depend cumulatively and synergistically on the electronic properties of the constituent coordinatively irregular structures assembled therein.

The ability to separately tailor the electronic properties of the constituent coordinatively irregular structures provides tremendous latitude in designing and producing semiconductor materials with novel electronic properties. The present invention permits control of the chemical bonding, structural distortions, state of order and hence, the bandgap and other electronic properties of semiconductor materials. Whereas the electronic properties of single crystalline and amorphous silicon are well established, the electronic properties of the coordinatively irregular structures of the present invention are new and unpredictable. Such structures represent a new phase of matter with previously unrealized chemical bonding not properly characterized as ordered as in crystalline silicon or disordered as in amorphous silicon. As a result, the assemblage of coordinatively irregular structures into a semiconductor body provides an opportunity to quantum mechanically mix the electronic properties of single crystalline and amorphous silicon in counterintuitive ways to create a fundamentally new type of non-single crystalline material with unique and unexpected properties. With this invention, for example, it is possible to prepare a non-single crystalline silicon-based semiconductor material, that does not include a bandgap narrowing element, with sufficient absorption in the red and near-infrared to render it useful as a long wavelength solar energy absorbing material.

An important feature of the present invention is the realization of non-single crystalline semiconductor materials with a spatially controlled size distribution of coordinatively irregular structures. The size of coordinatively irregular structures in directions of non-atomic thickness can be controlled by varying relevant processing parameters associated with the formation and/or treatment steps. In the embodiment in which plasma enhanced chemical vapor deposition is used to form the sub-coalescent structures, for example, factors such as the growth temperature, reactant flow rate, hydrogen gas dilution ratio, and plasma power can be used to control the size of sub-coalescent structures produced in the formation step. In embodiments in which a two-part formation step is used, etching conditions provide control over the size of sub-coalescent structures. The extent of surface termination can be controlled by varying the plasma density and/or exposure time of the treatment step. The surface can be lightly or fully terminated. The unterminated portions of the surface remain available for later reaction with reactant species in a subsequent formation step. Hence, by controlling the conditions associated with the formation and treatment steps, and varying those conditions over sequential application of the steps to form the ultimate semiconductor body, it is possible to achieve virtually any spatial size and shape distribution of coordinatively irregular structures with the present invention. Constant conditions for repeated applications of the formation and treatment steps, for example, can lead to an ultimate semiconductor body comprised of a substantially uniform or homogeneous distribution of coordinatively irregular structures, while variable conditions from application to application of the two steps can lead to a material with a non-uniform or heterogeneous distribution of coordinatively irregular structures. The number of applications of the formation and repair steps provides control over the thickness of the ultimate semiconductor body formed.

The present invention further provides for the preparation of composite materials comprised of coordinatively irregular structures incorporated into an amorphous, crystalline, microcrystalline or polycrystalline matrix. Such composites can be realized, for example, by first forming an amount of matrix material and then using the process of the present invention to form an amount of coordinatively irregular material thereupon. Additional amounts of matrix material and additional coordinatively irregular structures can subsequently be formed sequentially to build up a composite material comprised of a spatially controlled distribution of coordinatively irregular structures of desired sizes and properties in a matrix material.

Various ordered and disordered semiconductor materials have been discussed in the prior art. In U.S. Pat. No. 5,103,284 entitled "SEMICONDUCTOR WITH ORDERED CLUSTERS", Ovshinsky et al. prepared semiconductor materials containing ordered clusters with sizes between 12 and 50 Å in diameter. Embodiments in which the ordered clusters were incorporated into a matrix were also disclosed. The materials were prepared using laser ablation sputtering, chemical vapor deposition, plasma deposition processes, and evaporation processes. The ordered clusters were disclosed as having periodicity and local order differing from amorphous or fully crystalline material and were required to be present at a volume fraction that meets or exceeds the percolation threshold of the material. Attainment of the percolation threshold led to a substantial change in the physical properties of the material and a decoupling of at least one pair of physical properties of the ordered cluster material that are coupled when the material is in the single crystalline, polycrystalline or amorphous state.

In U.S. Pat. No. 6,087,580 entitled "SEMICONDUCTOR HAVING LARGE VOLUME FRACTIONS OF INTERMEDIATE RANGE ORDER MATERIAL", Ovshinsky et al. described a non-single crystalline silicon alloy material containing regions of intermediate range order crystallites with sizes between 10 and 50 Å and a volume percent of at least 8 percent, but below the percolation threshold. The material disclosed therein was prepared by a one-step PECVD process using $Si_2H_6$ and $H_2$. The inventors showed that the volume fraction of intermediate range order material could be increased by increasing the ratio of the flow rate of $H_2$ relative to $Si_2H_6$.

The present non-single crystalline semiconductor material comprised of an assembly of coordinatively irregular structures is distinguished from the ordered cluster material of U.S. Pat. No. 5,103,284 and the intermediate range order material of U.S. Pat. No. 6,087,580 in that, no atomic scale thickness aspect is associated with the ordered clusters or intermediate range order material. The coordinatively irregular structures of the present invention require an atomic scale thickness in one or two directions. This thickness requirement produces the reduced dimensionality and unconventional chemical bonding that is responsible for the unexpected electronic properties of the coordinatively irregular structures of the present invention.

In an article entitled "EXTREMELY NARROW BAND GAP, ~1.50 eV, AMORPHOUS SILICON" published in Materials Research Society Symposium Proceedings, vol. 507, pp. 211–216 (1998), Fukutani et al. reported a two step radio-frequency glow discharge plasma deposition process for preparing hydrogenated amorphous silicon films with bandgaps narrower than 1.55 eV. The first step of the process of Fukutani et al. is a deposition step in which amorphous hydrogenated silicon is formed from $SiH_4$. The deposition step is followed by an argon annealing step. Upon completion of the deposition step, plasma-excited argon is introduced into the glow discharge reactor to treat the amorphous hydrogenated silicon. Fukutani et al. showed that the argon annealing step leads to a reduction in the amount of hydrogen contained in the amorphous hydrogenated silicon produced in the deposition step. They also showed that the bandgap of their material decreases as the hydrogen content decreases.

The present inventors attempted to duplicate the results of Fukutani et al. Instead of treating the sub-coalescent structure formed in the formation step with a plasma comprising hydrogen and/or fluorine, the present inventors tested an argon plasma in the treatment step. The present inventors were unable to achieve a reduction in the bandgap of an ultimate semiconductor body comprised of silicon prepared through repeated application of a formation step and a test argon plasma treatment step. The bandgap obtained by the present inventors when using a test argon plasma treatment step corresponded to the bandgap typically observed for amorphous silicon, Two differences between the test argon plasma process used by the present inventors and the argon annealing process of Fukutani et al. are noted. First, the argon annealing process of Fukutani et al. involved microwave excitation of argon to produce a plasma, while the test argon plasma treatment step completed by the present inventors was excited by a radiofrequency generator. Since microwave excited plasmas are denser and more energetic than radiofrequency excited plasmas, it is conceivable that Fukutani et al. had excited argon radical species in their plasma that were not present in the test plasma used by the present inventors. Second, in the argon annealing process of Fukutani et al., the argon plasma was applied to a conventional, extended three-dimensional layer of amorphous silicon. The present inventors applied their argon plasma treatment step to sub-coalescent structures. It is conceivable that argon plasmas affect conventional amorphous silicon differently than a material comprised of an assembly of sub-coalescent structures.

Notwithstanding the inability of the present inventors to duplicate the work of Fukutani et al., the present invention is further distinguished from that work in a fundamental way. The novel electronic properties of the semiconductor body of the present invention, including the improved absorbance in the red and near-infrared of the non-single crystalline silicon embodiment of the present invention relative to amorphous silicon, are a consequence of the unexpected properties associated with the reduced dimensionality of the coordinatively irregular structures assembled within the semiconductor. Fukutani et al. attribute the bandgap reduction in their material to a reduction in the hydrogen content and indicate that the structural state in their narrow bandgap material is almost identical to that of standard amorphous hydrogenated silicon. Consequently, in contrast to the present invention, the dimensionality is not essential to the properties of the material of Fukutani et al. Furthermore, in the non-single crystalline silicon embodiment of the present invention, a reduction in bandgap was observed when a hydrogen plasma was used in the treatment step. In this case, the hydrogen content of the ultimate semiconductor is expected to be higher, not lower, than the hydrogen content of amorphous silicon.

Preparation conditions for typical embodiments prepared from $SiH_4$ in a plasma enhanced chemical vapor deposition (PECVD) process using a hydrogen plasma in the treatment step are summarized in Table 1. Table 1 includes information on the reactant mixture, durations, and total preparation time for four non-single crystalline silicon materials prepared with this invention. The preparation of material 5-147 does not include a treatment step and leads to production of a conventional amorphous silicon material. It is included for later comparison of physical characteristics. The total time listed in the table refers to the total preparation time and represents a sum over a series of cycles where each cycle corresponds to the sequential application of one formation step and one treatment step. The materials presented in Table 1 were obtained using multiple cycles of fixed duration formation and treatment steps. The fixed durations are indicated in the table. The material thickness varies in a way that is consistent with the relative amount of hydrogen used in the treatment step of each material. Longer $H_2$ treatment times (relative to the formation step time) lead to thinner materials due to enhanced etching.

TABLE 1

| | Formation Step | | | | |
|---|---|---|---|---|---|
| Sample | Reactant Volume Ratio SiH$_4$:H$_2$ | Time (s) | H$_2$ Treatment Step Time (s) | Total Time (min) | Thickness (nm) |
| 5-147 | Pure SiH$_4$ | — | 0 | 8 | 44.65 |
| 5-146 | 1:10 | 1 | 4 | 70 | 47.8 |
| 5-148 | 1:10 | 1 | 2 | 70 | 83.2 |
| 5-149 | 1:10 | 2 | 2 | 33 | 60.2 |

The characteristics of the non-single crystalline silicon materials included in Table 1 have been evaluated by several methods. A measurement of the absorption coefficient of a material as a function of photon energy or wavelength is known as the photon absorption spectrum of a material. The photon absorption spectrum provides a measure of the bandgap of a material as well as an indication of the state of order of a material.

Figure 1:
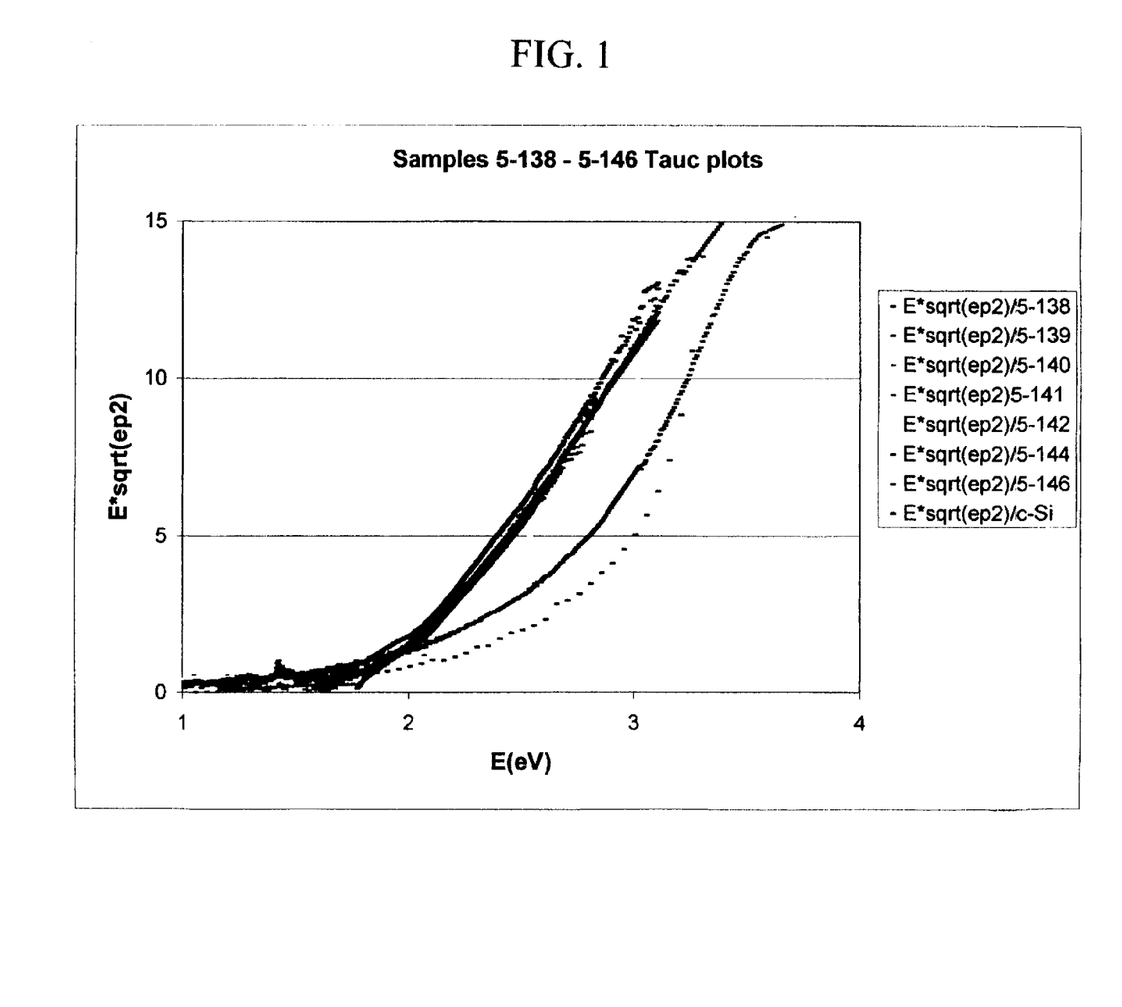
FIG. 1 is a Tauc plot derived from the photon absorption spectrum of embodiment 5-146 of a silicon-based material of the present invention. Curves for single crystalline silicon and conventional hydrogenated amorphous silicon are shown for comparison. Embodiment 5-146 was prepared from a mixture of $SiH_4$ and $H_2$ in a 1:10 volume ratio using a 4 second formation step and a 1 second treatment step.

Referring now to FIG. 1, there is shown a Tauc plot derived from the photon absorption spectrum of embodiment 5-146. Tauc intensity is plotted as a function of photon energy. Curves for crystalline silicon and conventional amorphous silicon are shown in the plot for comparison. The curve for crystalline silicon is the rightmost curve, the curve with the greatest spacing between data points shown in the figure. The curve for amorphous silicon is a linear curve among the leftmost group of curves shown in the figure. The curve for embodiment 5-146 is the curve between the leftmost group of curves and the rightmost curve associated with crystalline silicon.

Tauc plots are frequently used to determine the bandgap energy of materials that are amorphous, non-crystalline, disordered or mixed phase. The shape of the Tauc plot depends on the state of structural order of the material. According to theory, amorphous materials exhibit linear Tauc plots, while single crystalline materials exhibit curved Tauc plots. The extent of linearity increases as the degree of structural order in the material decreases.

FIG. 1 shows, as expected from theory, that the Tauc response of amorphous silicon is linear and that the Tauc response of single crystalline silicon is curved. Theoretical analysis of the Tauc plots indicates that single crystalline silicon has a bandgap energy of 1.1 eV and amorphous silicon has a bandgap energy of 1.8 eV. The Tauc plot for embodiment 5-146 is intermediate in both energy and curvature between the Tauc plots of single crystalline and amorphous silicon. This result indicates that the bandgap energy and state of structural order of embodiment 5-146 are intermediate between those of single crystalline and amorphous silicon. By varying the size and spatial distribution of coordinatively irregular structures contained in a material, it is possible to continuously control the state of structural order, bandgap energy and other electronic properties of non-single crystalline silicon materials with this invention.

Figure 2:
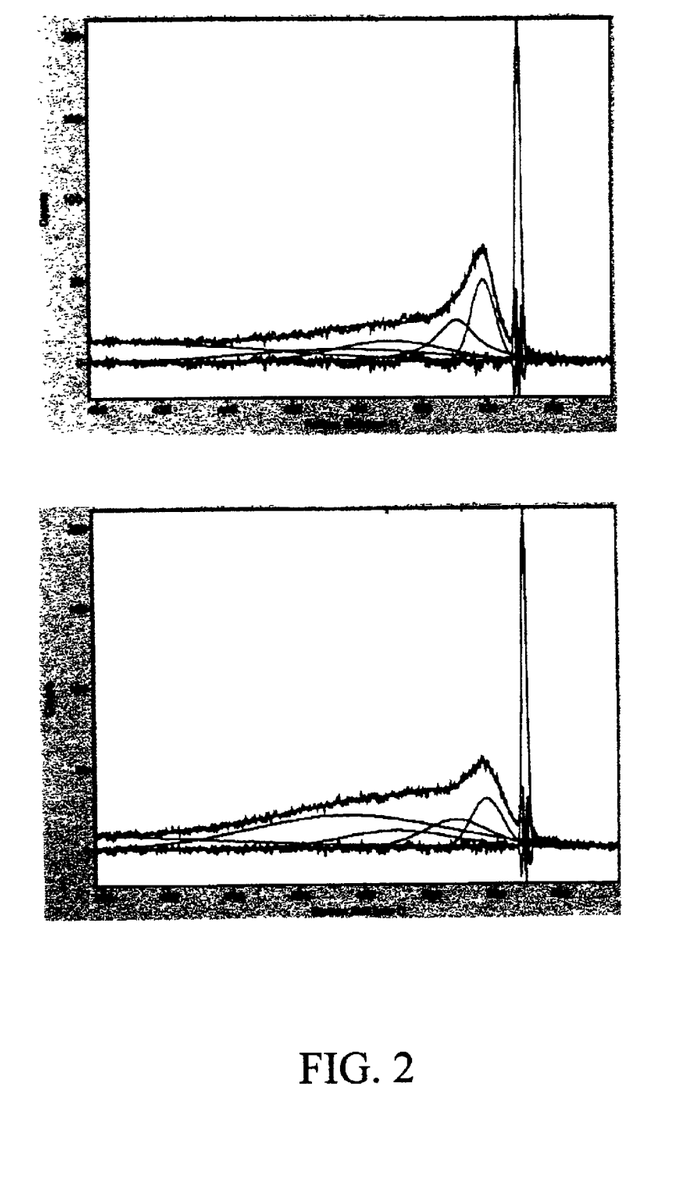
FIG. 2 shows Raman spectra of embodiments 5-146 (upper) and 5-148 (lower). The two embodiments correspond to different silicon-based materials of the present invention. Embodiment 5-146 was prepared from a mixture of $SiH_4$ and $H_2$ in a 1:10 volume ratio using a 4 second formation step and a 1 second treatment step. Embodiment 5-148 was prepared from a mixture of $SiH_4$ and $H_2$ in a 1:10 volume ratio using a 1 second formation step and a 2 second treatment step.

Referring now to FIG. 2, there is shown Raman spectra for embodiments 5-146 (upper) and 5-148 (lower). Raman spectra provide information about vibrational and phonon modes of materials. The vibrational and phonon modes of materials are characteristic of the chemical bonding and structure of a material. Since every material has a distinct Raman spectrum, Raman spectroscopy can be used to distinguish different materials. In the case of silicon-based materials, Raman spectroscopy can be used to characterize the state of structural order present in a material. The energy and linewidth of TO (transverse optical) phonon modes are commonly used to assess the structural order of silicon-based alloy materials. The TO mode of single crystalline silicon shows a sharp, single Raman line at 522 cm$^{-1}$, while the TO mode of amorphous silicon shows a broad asymmetric band centered at 475 cm$^{-1}$. Silicon based materials with structural order between amorphous silicon and single crystalline silicon show TO phonon lines between 475 cm$^{-1}$ and 522 cm$^{1}$ with intermediate linewidths.

Each Raman spectrum shown in FIG. 2 can be resolved into five overlapping contributions. The elevated baseline on the low energy side of each spectrum originates from the high energy tail of the (LO) longitudinal optical phonon mode centered near 400 cm$^{1}$. This feature is not normally used in the assessment of structural order in silicon-based materials. In addition to the LO tail, deconvolution of the Raman spectra of the two embodiments reveals four bands associated with TO phonon modes in each spectrum. These bands are centered at approximately 475 cm$^{-1}$, 490 cm$^{-1}$, 510 cm$^{-1}$, and 520 cm$^{-1}$. The resolved Raman bands broaden and decrease in maximum intensity with decreasing energy. The 475 cm$^{-1}$ band is attributable to amorphous silicon. The band at 520 cm$^{-1}$ is significantly broader than the well-known sharp line observed at 522 cm$^{-1}$ in single crystalline silicon and is attributed to microcrystalline silicon. The 510 cm$^{-1}$ band is assigned to a form of microcrystalline silicon that is less ordered than the form responsible for the 522 cm$^{-1}$ band. The band at 490 cm$^{-1}$ is attributable to coordinatively irregular structures. Since the Raman experiment is not a spatially resolved measurement, the 490 cm$^{-1}$ band is a composite feature that reflects a superposition over the assembly of coordinatively irregular structures contained in each embodiment. The Raman spectra indicate that embodiments 5-146 and 5-148 are comprised of three components: coordinatively irregular structures, microcrystalline silicon and amorphous silicon.

The integrated areas of the Raman bands associated with each component can be used to quantify the relative amount of each component in the non-single crystalline silicon material of the present invention. Table 2 summarizes the results of deconvoluting the Raman spectra for the four embodiments of the non-single crystalline silicon materials presented in Table 1. Table 2 shows the integrated area of the TO Raman band associated with the amorphous, coordinatively irregular, and microcrystalline components of each embodiment expressed as a percentage relative to the total TO Raman intensity. The microcrystalline component represents the combined contributions of the 510 cm$^{-1}$ and 520 cm$^{-1}$ bands. The Raman data show that embodiment 5-147, the embodiment whose preparation did not include a treatment step (see Table 1), contains the smallest contribution of coordinatively irregular structures and no microcrystalline component. Inclusion of a treatment step (embodiments 5-146, 5–148, 5-149) leads to the formation of coordinatively irregular and microcrystalline components. The concentration of the coordinatively irregular and microcrystalline components relative to the amorphous component increases as the duration of the treatment step increases relative to the duration of the formation step. In embodiment 5-149, a 2 second formation step and 2 second treatment step are used to produce a material that has a higher concentration of coordinatively irregular structures and microcrystalline silicon than embodiment 5-147. The formation of coordinatively irregular structures and microcrystalline silicon comes at the expense of the amorphous component in embodiment 5-149 relative to embodiment 5-147. This trend continues in embodiments 5-148 and 5-146, both of which show substantial concentrations of coordinatively irregular structures and microcrystalline silicon. The higher intensity of the microcrystalline Raman feature in embodiment 5-146 relative to embodiment 5-148 indicates that a higher concentration of microcrystalline silicon is present in embodiment 5-146. This observation is consistent with the greater etching expected for embodiment 5-146 on the basis of the longer $H_2$ treatment step used in its preparation (Table 1) and with a higher average state of order for embodiment 5-146.

TABLE 2

| | Relative Integrated Area of TO Raman Band (%) | | |
|---|---|---|---|
| Sample | Amorphous | Coordinatively Irregular | Microcrystalline |
| 5-147 | 92.06 | 7.94 | 0.00 |
| 5-146 | 26.17 | 25.44 | 48.38 |
| 5-148 | 53.86 | 16.21 | 29.93 |
| 5-149 | 89.96 | 9.14 | 0.90 |

The Raman spectrum of the prior art intermediate range order material described in U.S. Pat. No. 6,087,580 and Physical Review B, vol. 63, article 125338 (2001) was compared to the Raman spectra of various embodiments of the present non-single crystalline silicon material containing an assembly of coordinatively irregular structures. Comparisons were made between materials prepared with the same amount of hydrogen relative to $SiH_4$ or $Si_2H_6$. The preparations of the prior art materials and embodiments of the material of the present invention differ in the manner of introducing the hydrogen. Whereas in the prior art intemediate range order material all of the $H_2$ was introduced simultaneously with the $SiH_4$ or $Si_2H_6$ in a single preparation step, in the non-single crystalline silicon materials of this invention some of the $H_2$ was introduced separately in the treatment step of a two-step preparation process. The Raman spectra of the prior art materials and materials of the present invention clearly differed. The Raman spectra of the materials of the present invention were generally broader than the Raman spectra of prior art materials and included higher intensity Raman peaks in the energy range at and near 490 $cm^{-1}$. The Raman results indicate that the regions of intermediate range order in the prior art materials of U.S. Pat. No. 6,087,580 and Physical Review B, vol. 63, article 125338 (2001) are distinct from the coordinatively irregular structures of the present material. Consequently, the effect of hydrogen as a diluent in the prior art is distinguished from the effect of hydrogen in the treatment step of the present invention.

X-ray diffraction is another method for assessing the structural state of a material. An x-ray diffraction plot measures the intensity of a diffracted x-ray beam as a function of the angle of orientation of a material relative to the direction of an incident x-ray beam. Strong diffracted x-ray intensity occurs at orientation angles determined by interatomic spacings characteristic of the structure of a material. The relationship between orientation angle and interatomic spacing is most simply expressed by Bragg's Law. Since highly ordered materials such as single crystals have well-defined periodic structures, they exhibit a series of diffracted x-ray intensity peaks with narrow linewidths at orientation angles characteristic of the limited number of well-defined interatomic spacings of the material. Amorphous materials, on the contrary, do not exhibit a periodic series of interatomic spacings and do not exhibit a series of narrow diffraction peaks in an x-ray diffraction experiment. Instead, amorphous materials exhibit broad x-ray diffraction peaks with large linewidths that are characteristic of the continuous, rather than discrete and periodic, length scales that define their structure. Materials with intermediate order exhibit x-ray diffraction peaks with linewidths intermediate between those of the amorphous and single crystalline states of the same material. Consequently, x-ray diffraction linewidths provide a guide to the state of order of a material.

The present inventors obtained x-ray diffraction plots for embodiments 5-146 and 5-148 of this invention. The plots showed the diffracted x-ray intensity of embodiment 5-146 and 5-148 as a function of orientation angle (2-Theta). Two x-ray diffraction peaks were observed in the range of orientation angles considered for both embodiments. The central positions of the diffraction peaks corresponded to positions observed for single crystalline silicon. The linewidths of the two peaks, however, were much larger than those observed for single crystalline silicon and are intermediate between those typically observed for single crystalline silicon and amorphous silicon. The x-ray diffraction data thus indicate that each of the two embodiments possesses a state of order intermediate between single crystalline and amorphous silicon. This conclusion is consistent with the presence of amorphous, coordinatively irregular, and microcrystalline regions observed in the Raman spectra of the two embodiments.

Relative to embodiment 5-146, the x-ray diffraction peaks of embodiment 5-148 were broadened. The larger x-ray diffraction linewidth of embodiment 5-148 is an indication of a greater degree of structural disorder and more overall structural distortion relative to embodiment 5-146. Comparison of the x-ray diffraction results for embodiments 5-146 and 5-148 are consistent with the Raman results which show that greater etching and formation of microcrystalline silicon occur in the preparation of embodiment 5-146. Since microcrystalline silicon is a more ordered state than the coordinatively irregular structures of the present invention, embodiment 5-146 appears on average to be a more ordered structure than embodiment 5-148.

Figure 3:
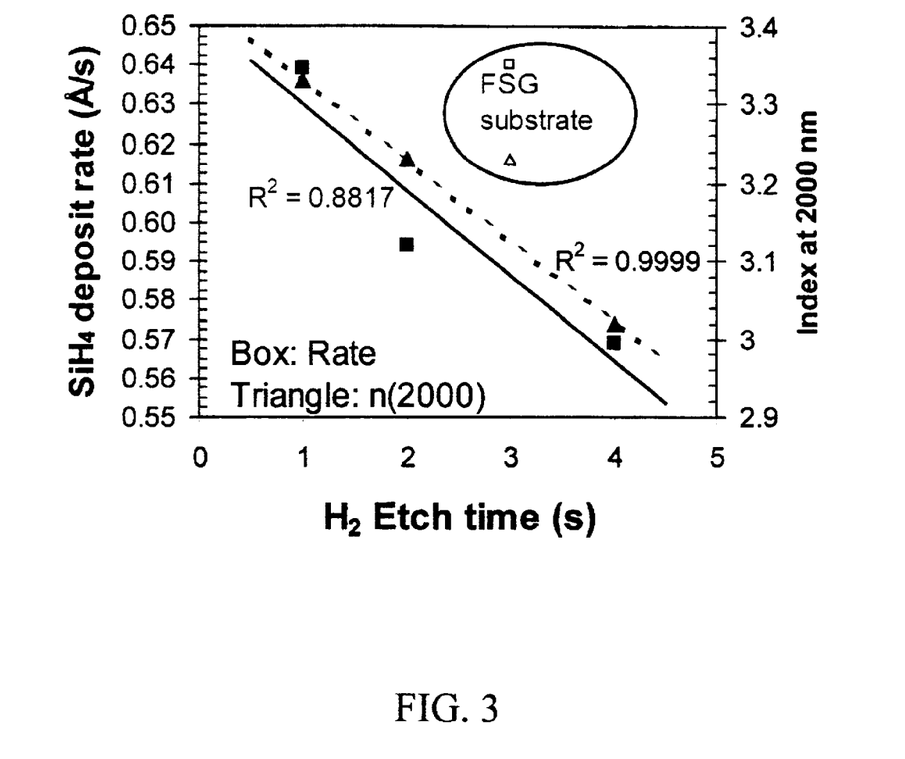
FIG. 3 shows a plot of deposition rate and refractive index of different embodiments of silicon-based materials of the present invention.

Referring now to FIG. 3, there are shown plots of the deposition rate and refractive index of different silicon-based embodiments of the present invention. The data were obtained on ultimate semiconductor bodies produced upon application of several cycles of constant duration formation and treatment steps. The deposition rate provides a measure of the rate of change of the overall thickness of the ultimate semiconductor body as a function of the duration of the treatment step. The time basis for the deposition rate is the time associated with the deposition steps over all cycles and does not include time associated with the treatment step. The hydrogen treatment time axis refers to the treatment time associated with one treatment cycle. The deposition rate data show a decrease in deposition rate with increasing hydrogen treatment time and are consistent with increased etching as the treatment time increases, in agreement with the Raman data.

The refractive index data provide a measure of the density of the ultimate semiconductor body formed. Dense samples exhibit higher refractive indices than porous samples. The reduction in refractive index observed upon increasing the hydrogen treatment time per cycle indicates that the ultimate semiconductor body becomes less dense as the hydrogen treatment time per cycle increases. This result is consistent with enhanced etching of the ultimate semiconductor body as well as with higher porosity. The enhanced etching leads to a more porous material.

The deposition rate and refractive index data indicate that hydrogen treatment interrupts the growth of the material and inhibits the formation of individual layers of the ultimate semiconductor material. This observation is consistent with the presence of sub-coalescent structures in the evolving material. Furthermore, the notion of layer-by-layer growth is not applicable to the ultimate semiconductor material. A more applicable description is growth of the ultimate semiconductor body through the stabilization and assemblage of coordinatively irregular structures formed via intermediary non-layered sub-coalescent structures.

The experimental data obtained by the present inventors show that by varying the durations of the formation and treatment steps, it is possible to produce non-single crystalline silicon materials with different states of order and a different distribution of coordinatively irregular structures. Embodiments 5-146 and 5-148 are examples based on repeated application of formation and treatment steps of constant durations and flow rates. Accordingly, embodiments 5-146 and 5-148 exemplify materials that contain a uniform or homogeneous spatial distribution of coordinatively irregular structures. Embodiments containing a non-uniform or heterogeneous spatial distribution of coordinatively irregular structures are also possible with this invention. A heterogeneous spatial distribution of coordinatively irregular structures refers to a distribution of the size or position of coordinatively irregular structures that varies from one portion of a material to another. A semiconductor material containing a heterogeneous distribution of coordinatively irregular structures comprises an assembly of coordinatively irregular structures that are not substantially identical to each other.

A semiconductor material containing a heterogeneous distribution of coordinatively irregular structures can be prepared by varying the conditions used in the formation and/or treatment steps upon successive application of said steps to form an ultimate semiconductor body. For example, application of a 1 second formation step and 4 second treatment step produces a volume of material with the distribution of coordinatively irregular structures corresponding to embodiment 5-146. Subsequent application of a 1 second formation step and a 2 second treatment step adds a new volume of material with the distribution of coordinatively irregular structures corresponding to embodiment 5-148. The relative proportions of the two volumes of material depend on the number of cycles of each combination of formation and treatment steps. The relative proportions can be continuously adjusted by varying the number of cycles to obtain a wide range of materials, each of which exhibits a distribution of coordinatively irregular structures and electronic properties distinct from each other and distinct from embodiments 5-146 and 5-148. The ability to independently control and vary the durations of the deposition and repair steps over a series of cycles permits the production of non-single crystalline silicon alloy materials with a virtually unlimited number of possible spatial distributions of coordinatively irregular structures. Similar non-single crystalline silicon alloy materials can be prepared by varying the flow rates or concentrations used in the formation and treatment steps instead of the durations. Further control of the distribution of coordinatively irregular structures and the rate of formation of a volume of material can be achieved by varying the conditions used in the formation step (e.g. ratio of $H_2$ to $SiH_4$, growth temperature, or related deposition variables).

The ability to control the size and spatial distribution of coordinatively irregular structures provides an opportunity to systematically vary the structural order, coordination properties and bonding configuration of non-single crystalline silicon materials and to thereby realize the unique and unexpected electronic properties available from coordinatively irregular structures. The material made available by this invention is a fundamentally new type of material capable of providing the rational design of electronic properties through the controlled formation of coordinatively irregular structures.

The achievement of new and unexpected electronic properties in the material of the present invention is a consequence of the unconventional chemical bonding that arises from the various states of order and distorted bonding configurations achievable in the coordinatively irregular structures. In single crystalline silicon, the silicon atoms are identically arranged in a regular tetrahedral local geometry. Each silicon atom is bonded to four other silicon atoms and is therefore coordinatively saturated. In amorphous silicon, however, the bonding of silicon is not regular and a distribution of silicon coordination environments is present. The bond angles and bond lengths of silicon spatially vary in a random way in amorphous silicon. Additionally, some silicon atoms in amorphous silicon are coordinatively unsaturated in that they are bonded to fewer than four atoms. The bonds that are present in coordinatively unsaturated silicon atoms are highly strained and strongly distorted relative to the preferred regular tetrahedral bonds found in single crystalline silicon. The bonding orbitals of coordinatively unsaturated silicon atoms that are directed at the unfilled coordination positions correspond to dangling bonds and constitute defects in amorphous silicon.

The hydrogen supplied to the sub-coalescent structures in the treatment step of the present invention acts to saturate dangling bonds by providing a species that readily bonds to silicon. The availability of plasma activated hydrogen leads to saturation of coordinatively unsaturated silicon through the termination of dangling silicon bonds with hydrogen to form Si—H bonds. The formation of Si—H bonds reduces the defect density and leads to improved electronic properties. The present inventors have discovered that the introduction of hydrogen and other gases in a treatment step can be used to control the state of order in non-single crystalline silicon materials through disruption of the Si—Si network, formation of coordinatively irregular structures and consequent structural relaxation.

The coordination saturation effects of treatment gases also influence the state of order by improving the regularity of bonding. The deviations of the bond angles and bond lengths of silicon from a regular tetrahedral arrangement become less pronounced in non-single crystalline silicon materials upon coordination saturation. The effect is strongest for the highly distorted silicon atoms in the sub-coalescent structures that are coordinatively unsaturated prior to plasma treatment, but also occurs secondarily for coordinatively saturated silicon atoms in the sub-coalescent structures that relax in response to the decreased bonding distortions of the coordinatively unsaturated silicon atoms upon exposure to hydrogen or another treatment gas to form coordinatively irregular structures from the sub-coalescent structures formed in the formation step. The net result of the treatment step, therefore, is an overall transformation of a non-single crystalline silicon material to a material containing surface terminated coordinatively irregular structures that are more ordered than amorphous silicon. An overall transformation of the sub-coalescent structures to the more ordered state corresponding to coordinatively irregular structures therefore occurs during the treatment step of the present invention. The extent of the transformation can be dictated in the present invention by controlling the size and concentration of sub-coalescent and/or coordinatively irregular structures through the durations or flow rates associated with the formation and/or treatment steps.

The non-single crystalline silicon material comprising an assembly of coordinatively irregular structures of the present invention can be prepared by a variety of processes. The sequential nature of the process for making the material affords flexibility in processing. The formation step can be accomplished by several methods including physical vapor deposition, chemical vapor deposition, plasma-enhanced chemical vapor deposition, laser ablation sputtering, and evaporation. Representative reactants for the deposition step include $SiH_4$, $Si_2H_6$ and related silicon compounds either undiluted or diluted with $H_2$. Sub-coalescent structures produced by these and related methods are suitable for the treatment step of the present invention. In the treatment step, the sub-coalescent structures are treated with plasma-activated hydrogen and/or fluorine and/or other treatment gas such as oxygen, nitrogen or argon in a suitable reaction chamber. In the preferred embodiment, the non-single crystalline silicon material of this invention is prepared by a process such as plasma-enhanced chemical vapor deposition in which the formation and treatment steps can be performed in the same reaction chamber. The preferred embodiment permits convenient application and variation of the durations or flow rates of the formation and treatment steps. Embodiments in which the material is transferred between different reaction chambers for the deposition and repair steps are also possible.

In addition to non-single crystalline silicon materials, the present invention extends to non-single crystalline germanium or silicon-germanium alloy materials. When germanium is alloyed into silicon-based materials, a reduction in bandgap energy occurs. A lower bandgap is desirable for solar cells and related devices because it leads to absorption of a greater fraction of the wavelength range emitted by the sun and higher solar device efficiencies. Although the presence of germanium is not required to lower the bandgap in the present invention, inclusion of germanium provides an additional degree of freedom for controlling the bandgap. For example, a particular bandgap energy can be achieved in different non-single crystalline silicon materials containing a different size or spatial distribution of coordinatively irregular structures if commensurately different amounts of germanium are present.

Although much of the foregoing discussion has focused on non-single crystalline silicon and germanium materials containing hydrogen and/or fluorine, the present non-single crystalline material comprising an assembly of coordinatively irregular structures can be prepared with a variety of compositions. It is to be recognized, for example, that the scope of the present invention extends to hydrogen and/or fluorine containing alloys of silicon with carbon, germanium, nitrogen and oxygen as well as to the n-type and p-type variations of each composition. Treatment gases such as oxygen, nitrogen, and/or argon are also within the scope of the present invention. The foregoing drawings, discussion and descriptions are not intended to represent limitations upon the practice of the present invention, but rather are illustrative thereof. It If is the following claims, including all equivalents, which define the scope of the invention.

We claim:

1. A semiconductor material comprising a plurality of coordinatively irregular structures, said coordinatively irregular structures being distorted from a regular tetrahedral bonding configuration and in a state of order intermediate between the amorphous and single crystalline phases with the same composition as said coordinatively irregular structures, each of said coordinatively irregular structures having an average thickness ranging from 1 to 5 atomic diameters.

2. The semiconductor material of claim 1, wherein said semiconductor material comprises silicon.

3. The semiconductor material of claim 2, wherein said semiconductor material further includes germanium.

4. The semiconductor material of claim 2, wherein said semiconductor material further includes hydrogen.

5. The semiconductor material of claim 2, wherein said semiconductor material further includes fluorine.

6. The semiconductor material of claim 2, wherein said semiconductor material further includes carbon.

7. The semiconductor material of claim 2, wherein said semiconductor material further includes oxygen.

8. The semiconductor material of claim 2, wherein said semiconductor material further includes nitrogen.

9. The semiconductor material of claim 2, wherein said semiconductor material further includes a dopant.

10. The semiconductor material of claim 1, wherein said coordinatively irregular structures are disposed in a matrix.

11. The semiconductor material of claim 10, wherein said matrix is of substantially the same composition as said coordinatively irregular structures.

12. The semiconductor material of claim 10, wherein said matrix includes amorphous regions.

13. The semiconductor material of claim 10, wherein said matrix includes microcrystalline regions.

14. The semiconductor material of claim 1, wherein said material is in the form of a thin film.

15. The semiconductor material of claim 14, wherein said thin film is incorporated into a photovoltaic device.

16. The semiconductor material of claim 14, wherein said thin film is incorporated into a diode.

17. The semiconductor material of claim 14, wherein said thin film is incorporated into a transistor.

18. The semiconductor material of claim 14, wherein said thin film is incorporated into a solar cell.

19. The semiconductor material of claim 1, wherein each of said coordinatively irregular structures has an average width ranging from 1 to 5 atomic diameters.

20. The semiconductor material of claim 1, wherein said semiconductor material is porous.

21. The semiconductor material of claim 1, wherein the bandgap energy of said semiconductor material is between 1.1 eV and 1.8 eV.

22. The semiconductor material of claim 1, wherein the refractive index of said semiconductor material is less than 3.32.

23. The semiconductor material of claim 1, wherein the refractive index of said semiconductor material is less than 3.22.

24. The semiconductor material of claim 1, wherein the refractive index of said semiconductor material is about 3.

25. A semiconductor body comprising coordinatively irregular structures, said coordinatively irregular structures being distorted from a regular tetrahedral bonding configuration and in a state of order intermediate between the amorphous and single crystalline phases with the same composition as said coordinatively irregular structures, each of said coordinatively irregular structures having an average thickness ranging from 1 to 5 atomic diameters, produced by a process comprising the steps of:

forming a semiconductor material;

treating said semiconductor material with a plasma of hydrogen, fluorine, or any combination thereof;

repeating said forming and treating steps as needed to produce a desired volume of said semiconductor body.

26. The semiconductor body of claim 25, wherein said semiconductor body comprises silicon, germanium, or a combination thereof.

27. The semiconductor body of claim 26, wherein said semiconductor body further includes hydrogen.

28. The semiconductor body of claim 26, wherein said semiconductor body further includes fluorine.

* * * * *